United States Patent
Di Iorio et al.

(10) Patent No.: US 8,248,862 B2
(45) Date of Patent: Aug. 21, 2012

(54) SOURCE BIAS SHIFT FOR MULTILEVEL MEMORIES

(76) Inventors: Ercole Rosario Di Iorio, Scurcola Marsicana (IT); Giulio Giuseppe Marotta, Contigliano (IT); Marco Domenico Tiburzi, Avezzano (IT); Pranav Kalavade, San Jose, CA (US)

(*) Notice: Subject to any disclaimer, the term of this patent is extended or adjusted under 35 U.S.C. 154(b) by 219 days.

(21) Appl. No.: 12/636,896

(22) Filed: Dec. 14, 2009

(65) Prior Publication Data

US 2011/0141822 A1  Jun. 16, 2011

(51) Int. Cl.
*G11C 7/00* (2006.01)
(52) U.S. Cl. ......... 365/189.02; 365/185.03; 365/185.09; 365/185.24
(58) Field of Classification Search ............. 365/185.02, 365/189.06
See application file for complete search history.

(56) References Cited

U.S. PATENT DOCUMENTS

| | | | | |
|---|---|---|---|---|
| 5,490,110 | A * | 2/1996 | Sawada et al. | 365/185.03 |
| 5,790,454 | A * | 8/1998 | Choi | 365/185.03 |
| 6,049,481 | A * | 4/2000 | Yamasaki | 365/185.23 |
| 6,490,196 | B1 * | 12/2002 | Hsu et al. | 365/185.03 |
| 7,515,467 | B2 * | 4/2009 | Yuda | 365/185.03 |
| 7,593,259 | B2 * | 9/2009 | Kim | 365/185.03 |
| 7,719,900 | B2 * | 5/2010 | Okayama et al. | 365/185.24 |
| 7,843,726 | B2 * | 11/2010 | Roohparvar et al. | 365/185.03 |
| 7,864,584 | B2 * | 1/2011 | Sarin et al. | 365/185.18 |

* cited by examiner

*Primary Examiner* — Tan T. Nguyen
(74) *Attorney, Agent, or Firm* — Trop, Pruner & Hu, P.C.

(57) ABSTRACT

The threshold voltage range of a multilevel memory cell may be increased without using a negative voltage pump. In one embodiment, an added positive voltage may be applied to the source of the selected cell. A boost voltage may be applied to the output of a sense amplifier. Non-ideal characteristics of a buffer that supplies the voltage to the selected cell may be compensated for in some embodiments.

27 Claims, 3 Drawing Sheets

SOURCE BIAS SHIFT FOR MULTILEVEL MEMORIES

BACKGROUND

This relates to multilevel memories.

Multilevel memories are memories that store more than two states. Multilevel memories may be used in a variety of memory technologies, including flash and phase change memories.

In some flash memories, there are two distinct states in which the cell is either conducting or non-conducting. Intermediate states between those cells may also be defined.

The number of states that may be achieved in one cell and the margin between states is a function of the available threshold voltage range. Basically, the two different primary states have different threshold voltages and the number of intermediate states between those threshold voltages may be determined by the range or distance between them. Normally, that range or distance must be sufficient to adequately distinguish the intermediate states.

DETAILED DESCRIPTION

In accordance with some embodiments of the present invention, a multilevel memory has a larger threshold voltage range. Thus, in some cases, the margin between levels may be greater and the number of levels, in some cases, may be increased. This is accomplished, in some embodiments, without using a negative voltage pump. The use of a negative voltage pump tends to be undesirable because of the expense involved. In addition, in some embodiments, noise cancellation may be provided.

Figure 1:
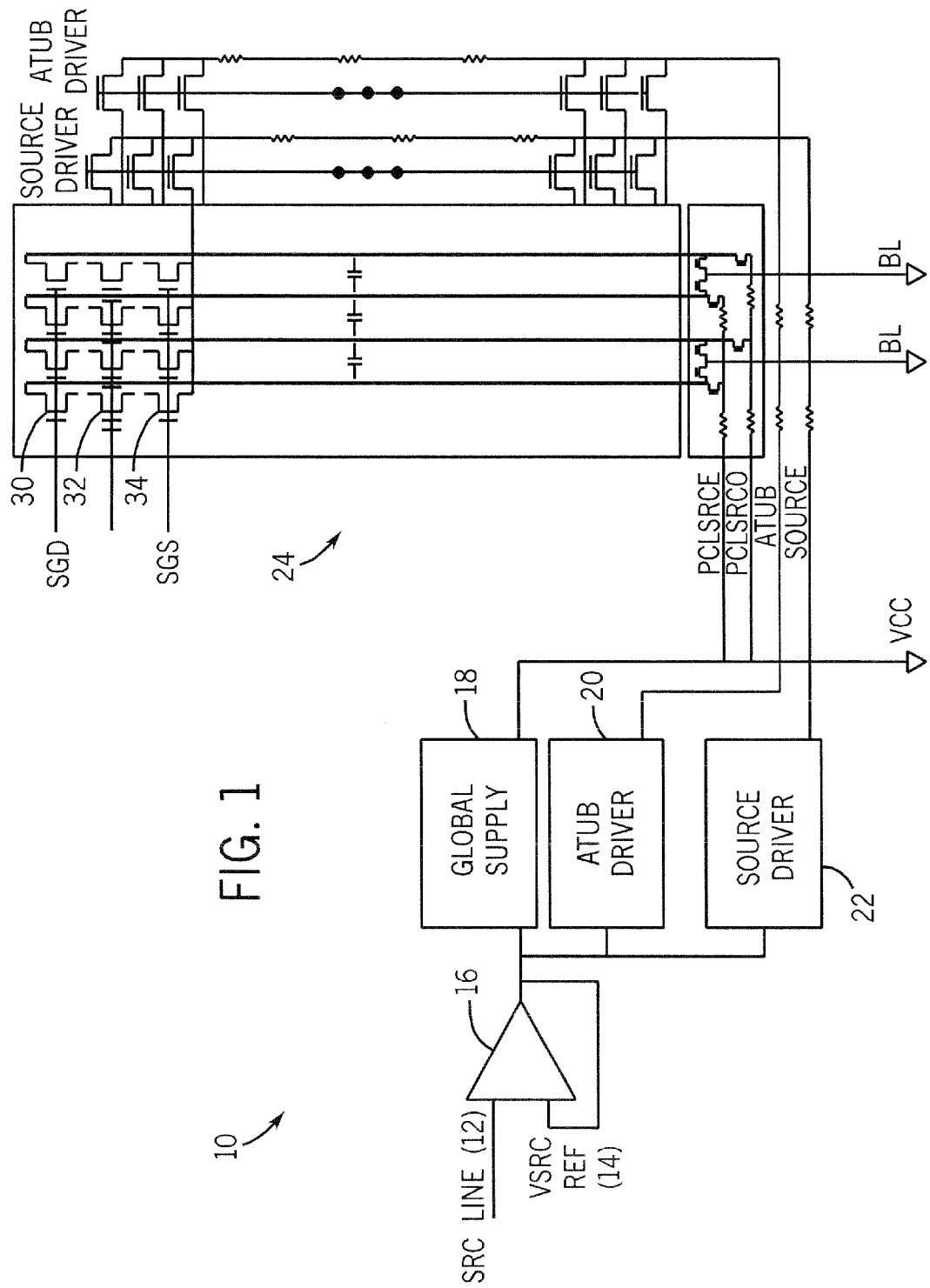
FIG. 1 is a schematic depiction of one embodiment of the present invention.

Referring to FIG. 1, a memory device 10 may be any multilevel memory, including a NOR flash memory, a NAND flash memory, or a phase change memory, to mention a few examples. The memory includes an array 24 of multilevel cells. A source (src) line 12 is coupled to an amplifier 16, as is a voltage source reference (Vsrc ref) 14. The output of the amplifier 16 is provided to a series of analog switches 18, 20, and 22. The analog switch 18 provides the global supply voltage levels. That is, one of a plurality of voltage supplies may be provided by the global supply analog switch 18. The ATUB driver analog switch 20 provides a voltage to the ATUB driver shown in FIG. 1. The source driver analog switch 22 provides the signal to the source driver, indicated in FIG. 1.

The output of the global supply analog switch 18 may be split into pclsrce and pclsrco. The pclsrce signal is coupled to the even bitlines and the pclsrco is coupled to the odd bitlines. A supply voltage (VCC) from the analog switch 18 is also coupled to a bit clamp generator circuit, not shown in FIG. 1. Likewise, the bitline signals (BL) are coupled to sense amplifiers, not shown in FIG. 1.

Coupled to the array are the select transistors 30 and 34 and the selected cell 32. Thus, the drain coupled select transistor 30 receives a signal sgd on its gate and the source coupled select transistor 34 receives the signal sgs on its gate. The signal applied to the gate of the selected cell is normally called the word line signal.

Figure 2:
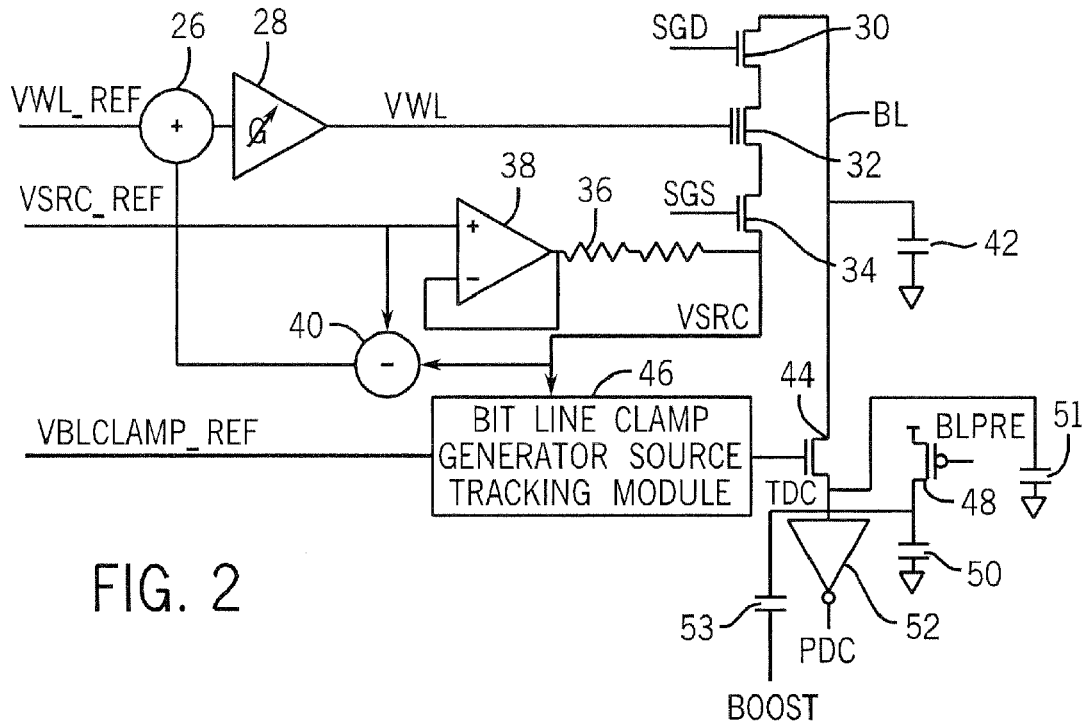
FIG. 2 is a schematic depiction of a circuit that operates with the circuit shown in FIG. 1 in accordance with one embodiment.

Referring to FIG. 2, the select transistors 30 and 34 and the selected cell 32 are depicted in the upper right hand corner. They are coupled to a bitline BL which has parasitic capacitance 42. The selected cell 32 is gate coupled to a buffer 28. The buffer 28 has, on its input, a voltage adder 26, coupled to the word line voltage reference (vwl_ref). In the case depicted, the buffer 28 is an idealized buffer represented by the circuitry made up of the adder 26, the subtractor 40, and the real word or non-ideal buffer 38, having output resistance 36. The effect of the output resistance 36 on the real word buffer 38 is that the buffer operates in a non-ideal way.

To achieve results that are closer to an ideal buffer 28, a correction is applied. The voltage output (vwl) of the buffer 28, a function of the word line voltage reference, is applied to the gate of the selected cell 32. The resulting voltage on the source of the cell is Vsrc. It is fed to a bitline clamp generator and source tracking module 46. It is also fed to a voltage subtractor 40. The subtractor 40 subtracts the actual source line voltage (Vsrc) from the source reference (Vsrc_ref).

Thus, if the actual source voltage Vsrc is x+y volts, for example, because of the non-ideal circuit behavior, the subtractor 40 subtracts the design source voltage Vsrc_ref, in this case x volts, from the actual source Vsrc voltage (x+y volts) and comes up with a voltage y (the error), that is applied to the adder 26. If, in this example, the voltage vwl_ref is z volts, z volts now becomes z+y volts at the output of the adder 26. As a result, vwl is z+y volts. When the source voltage y is subtracted, the design gate voltage z is applied to the selected cell 32. In effect, the non-ideal characteristics of the buffer 38 are canceled out so that more ideal characteristics may be achieved. The same techniques can be used to cancel out noise on the source drivers.

Figure 3:
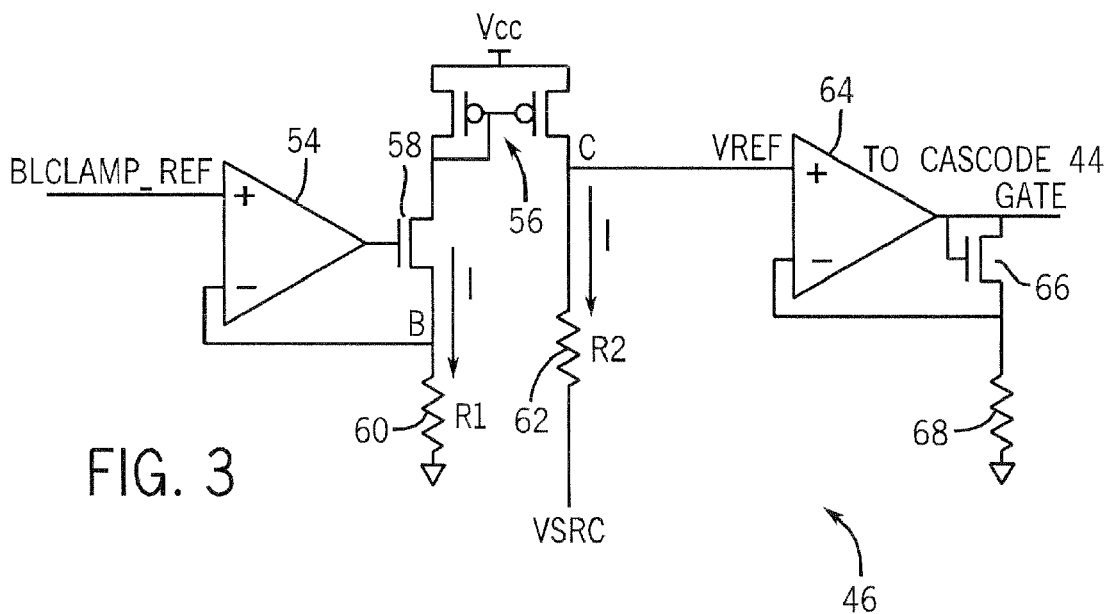
FIG. 3 is a more detailed depiction of the bitline clamp generator source tracking modules in accordance with one embodiment.

Referring to FIG. 3, the bitline clamp generator source tracking module 46 receives the supply voltage $V_{CC}$ from the global supply analog switch 18 (FIG. 1), the bitline clamp reference voltage blclamp_ref, and the source voltage Vsrc as inputs. (Note that FIG. 3 is, in this respect, inverted from FIG. 2). The voltage blclamp_ref is provided to the positive (non-inverting) input of the buffer 54, while the negative or inverting input is coupled to the source of the transistor 58. The source of the transistor 58 is also coupled to a resistance 60, label R1.

A pair of transistors 56, which may be p-channel transistors in one embodiment, are coupled to the supply voltage $V_{CC}$. As a result, a current I flows through the resistance R1 and through the resistance R2, also labeled 60 and 62. The drain of the rightmost transistor of the pair 56 is the voltage reference or Vref coupled to the positive or non-inverting terminal of the buffer 64. The negative or inverting terminal receives the feedback from the source of the transistor 66. The output of the buffer 64 is provided to the gate of the cascode transistor 44, shown in FIG. 2. The cascode transistor 44 operates as a sense amplifier. A resistor 68 is also coupled to the source of the transistor 66.

Thus, in one embodiment, the reference voltage Vref is equal to the bitline clamp reference voltage or blclamp_ref times the ratio of the resistance R2 to the resistance R1 plus the source voltage Vsrc. The current I is equal to the voltage blclamp_ref divided by the resistance R1.

Referring again to FIG. 2, the cascode transistor 44 has its source coupled to the drain of the selected cell 32. Its drain (tdc) is coupled to a parasitic capacitance 51. Its source is also coupled through a capacitance 53 to a boost signal, as indicated. In addition, the source is coupled to an inverter 52, which provides the signal pdc. Finally, the drain of the cascode transistor 44 is also coupled to the drain of a p-channel transistor 48 whose gate is coupled to the bitline pre-charge signal blpre. The drain is also coupled through a parasitic capacitance 50 to ground.

In order to expand the threshold voltage range, a negative voltage word line voltage is used so that, as the cell is erased, a negative threshold is programmed to the cell. To do this, a negative voltage is applied to the word line to read the threshold voltage of a selected cell. This expands the threshold voltage read range and also compacts the erase distribution which is normally in the negative range where reading would involve a negative charge pump. Therefore, raising the source voltage, for example, from 0 volts to 1.5 volts, is equivalent to applying a negative 1.5 volts to the word line. Thus, the existing positive charge pumps can be used to create an effective negative voltage on the word line. That increases the threshold voltage margin effectively by the amount of the source voltage shift (e.g. 1.5 volts) without requiring the use of a negative voltage pump.

One problem that this creates is that the voltage at the output of the cascode transistor 44 would not shift when reading to a conducting after a non-conducting cell. For example, the inverter 52 may have a typical switching threshold voltage of half the supply voltage and if the supply voltage is 2.4 volts, then the switching threshold may be 1.2 volts, for example. If the tdc voltage is above 1.2 volts, then the inverter 52 output is zero, and if it is below 1.2 volts, then the inverter output is a 1.

If a voltage (e.g. 1.5 volts) is added to the source voltage (e.g. 450 mV) to read the cell (see FIG. 4), and a voltage is applied to the word line, if the cell conducts then the bitline is discharged. But the bitline can only fall to the source voltage. So the inverter 52 will never switch because it never detects a zero or conducting state of the cell.

Figure 5:
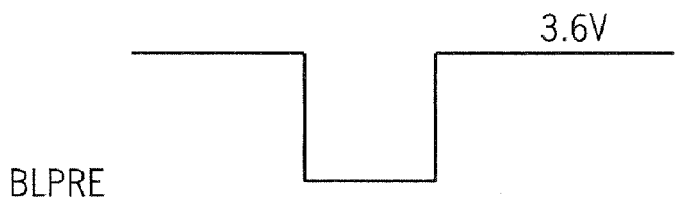
FIG. 5 is a timing diagram for the bitline pre-charge signal in accordance with one embodiment.

To overcome this problem, initially, a zero volt pre-charge (FIG. 5) is applied for a while to the gate of the transistor 48 (FIG. 2) through the signal bitline pre-charge blpre. This turns on the transistor 48 coupled to the blpre signal. Then tdc (FIG. 9) is charged to the supply voltage, for example, 2.4 volts. Thereafter, blpre is turned off and a boost signal (FIG. 10) is applied from 0 to $V_{CC}$. Then, tdc rises to $V_{CC}$ plus K times the boost signal. K is a partitioning due to the capacitive divider that results from the capacitances 51 and 53. The value of K depends on the size of the boost capacitor 53.

A cell may be selected by raising the select transistor 30, 34 gates sgd and sgs. If the cell is programmed, it does not conduct and the voltage stays there. If it is not programmed, it does conduct and the bitline discharges, as indicated by the dotted line in the tdc signal labeled "NOT PROG" in FIG. 9.

Figure 9:
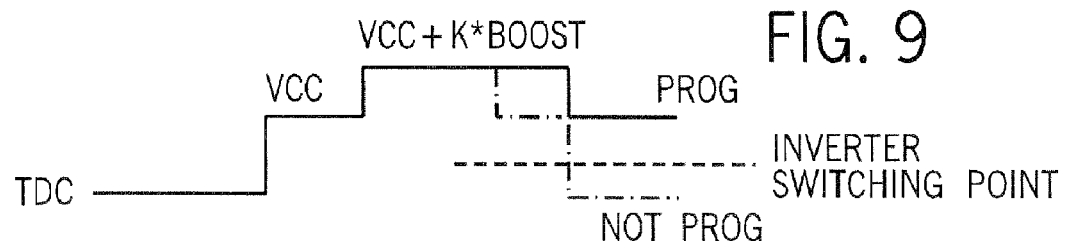
FIG. 9 is a timing diagram for the sense amplifier output voltage in accordance with one embodiment.
Figure 10:
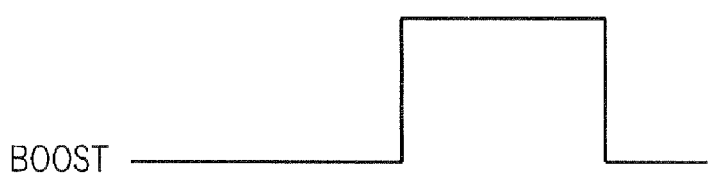
FIG. 10 is a timing diagram for a boost voltage applied to the output of a sense amplifier in accordance with one embodiment.

So now the range for the tdc conducting and not conducting signal extends across the inverter switching threshold, labeled "INVERTER SWITCHING POINT" in FIG. 9. Thus, the sense amplifier cascode transistor 44 supply voltage does not need to be redesigned or changed in some embodiments.

Figure 4:
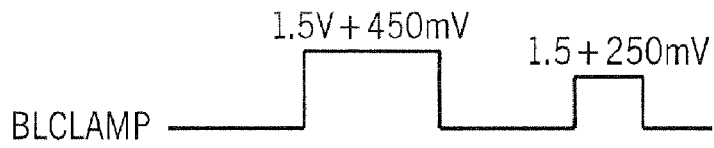
FIG. 4 is a timing diagram for the bitline clamp signal in accordance with one embodiment.
Figure 7:
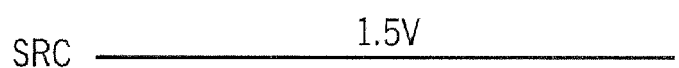
FIG. 7 is a timing diagram for the source voltage on a selected cell in accordance with one embodiment.

As shown in FIG. 4, the signal blclamp may be raised, in one embodiment, from 450 milliVolts for a standard design to 1.5 volts, as a result of the increase in 1.5 volts in the source voltage SRC (FIG. 7), as depicted. Normally, the source voltage may be zero volts. Thus, in a first phase, the bitline clamp voltage goes up to 1.5 volts plus 450 milliVolts, then comes down, and then goes back up again to 1.5 volts plus 250 milliVolts. The bitline pre-charge signal, shown in FIG. 5, goes from 3.6 volts, for example, down to zero, at a time period after the bitline clamp voltage has gone up. The voltage values are merely for illustration purposes.

Figure 6:
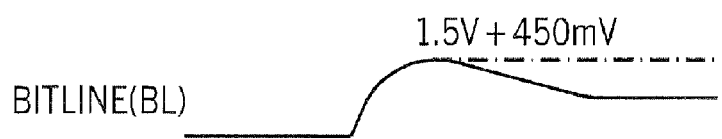
FIG. 6 is a timing diagram for the bitline signal in accordance with one embodiment.

As a result, the bitline voltage (FIG. 6) rises over a development period. If the cell is programmed, then it stays at the high level (dashed line in FIG. 6) of, in this example, 1.5 plus 450 milliVolts. If it is not programmed, it starts to drop, as indicated in the solid line in FIG. 6.

Figure 8:
FIG. 8 is a timing diagram for the select transistors coupled to the drain and source of a selected cell.

FIG. 8 shows the voltages to select the selected cell. To select the cell, the gate voltages of the select transistors may be raised to 3.6 volts, for example.

The tdc signal (FIG. 9) which, again, is the output of the cascode transistor 44 or sense amplifier, initially rises to V. This is the result of the bitline pre-charge signal (FIG. 5) turning on the transistor 44 and coupling tdc to the supply voltage V. Then, as a result of the boost signal (FIG. 10) coming on, the signal tdc rises to the supply voltage plus K times the boost signal (labeled VCC+K*BOOST, in FIG. 9). When the selected cell is deselected, the tdc signal falls to the programmed level (PROG in FIG. 9) if the cell is programmed and falls to the not programmed level (NOT PROG in FIG. 9) if the cell is not programmed. Note that intermediate between the programmed and not programmed levels is the inverter switching signal level, indicated in dashed lines in FIG. 9 and labeled "INVERTER SWITCHING POINT".

Thus, in some embodiments, the threshold voltage range can be increased without the need to use a negative voltage pump. For example, a three bit NAND cell may be designed to have a threshold voltage range of −1.5 volts to 5 or 6 volts, which may be a threshold voltage range increase of about 1½ volts relative to a cell that uses a zero voltage source bias.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
expanding a threshold voltage read range of a multilevel memory cell without using a negative voltage pump; and
applying a boost voltage to an output of a sense amplifier.

2. The method of claim 1 including applying a positive voltage to read the cell.

3. The method of claim 2 including pre-charging a bitline.

4. The method of claim 1 including applying a voltage to said cell using a buffer.

5. The method of claim 4 including correcting for a non-ideal characteristics of said buffer.

6. The method of claim 5 including subtracting a voltage on a source of the selected cell from a source reference voltage to create a difference.

7. The method of claim 6 including adding the difference to a reference voltage applied to said buffer.

8. The method of claim 1 including providing a bitline voltage generator to create a reference voltage applied to a sense amplifier.

9. The method of claim 8 including developing a current in said generator that is equal to a bitline clamp voltage applied to said generator divided by a first resistance in said generator, said reference voltage to said sense amplifier being equal to the bitline clamp reference voltage times a ratio of a second resistance to said first resistance plus a source voltage on said cell.

10. An apparatus comprising:
a multilevel memory cell having a source, drain, and gate;
a buffer to supply a word line voltage to the gate of said cell;
a bias circuit to apply a positive voltage to the source of said cell during reading; and
a subtracter coupled to the source of said cell, said subtracter to subtract a source reference voltage from a voltage of said source and to apply the difference to an adder, said adder coupled to said buffer.

11. The apparatus of claim 10 including a circuit to correct for non-ideal characteristics of a buffer coupled to the gate of said multilevel cell.

12. The apparatus of claim 10 including a sense amplifier coupled to the drain of said cell, said sense amplifier having an output coupled through a capacitor to a boost voltage, said boost voltage applied to a bitline when reading a cell on said bitline.

13. The apparatus of claim 12 including an inverter coupled to said capacitor, said boost voltage being sufficient to enable said inverter to switch when the cell is conducting even with said positive voltage applied to its source.

14. The apparatus of claim 12 including a bitline clamp generator coupled to said sense amplifier, said sense amplifier being a cascode transistor.

15. The apparatus of claim 14, said bitline clamp generator to supply a reference voltage to the gate of said cascode transistor that is equal to a ratio of resistances of resistors in said bitline clamp generator times a reference voltage applied to said bitline clamp generator plus the source voltage on said cell.

16. A method comprising:
reading a multilevel cell using a sense amplifier; and
applying a boost voltage to an output of said sense amplifier to enable an inverter coupled to said sense amplifier to shift, a source of a selected cell being biased so that without said boost voltage, the inverter will not switch when reading a conducting cell.

17. The method of claim 16 including applying a voltage to a gate of the cell using a buffer and correcting for a non-ideal characteristic of said buffer.

18. The method of claim 17 including subtracting a voltage on the source of a selected cell from a source reference voltage to create a difference and adding the difference to a reference voltage applied to said buffer.

19. The method of claim 16 including providing a bitline voltage generator to create a reference voltage applied to said sense amplifier.

20. The method of claim 19 including developing a current in said generator that is equal to a bitline clamp voltage applied to said generator divided by a first resistance in said generator, said reference voltage to said sense amplifier being equal to the bitline clamp reference voltage times a ratio of a second resistance to said first resistance plus the source voltage on said cell.

21. An apparatus comprising:
a non-volatile memory cell having a gate, source, and drain;
a buffer coupled to the gate of said cell; and
a circuit coupled to said cell and said buffer to correct for a non-ideal characteristic of said buffer.

22. The apparatus of claim 21, said circuit including a subtracter coupled to said source, said subtracter to subtract a source reference voltage from said source voltage and to apply the difference to an adder, said adder coupled to the input of said buffer.

23. The apparatus of claim 22, said drain coupled to a bitline, said bitline coupled to a cascode transistor.

24. The apparatus of claim 23 including a capacitor coupled to the sense amplifier output, said sense amplifier output coupled to a boost voltage, said sense amplifier coupled to an inverter, said boost voltage to switch said inverter when said cell is conducting.

25. The apparatus of claim 21 wherein said cell is a flash cell.

26. The apparatus of claim 25 wherein said cell is a NAND flash cell.

27. The apparatus of claim 21 wherein said cell is a phase change memory cell.

* * * * *